United States Patent [19]
Khang et al.

[11] Patent Number: 6,111,808
[45] Date of Patent: Aug. 29, 2000

[54] SEMICONDUCTOR MEMORY DEVICE

[75] Inventors: Chang Man Khang, Kyonggi-do; Young Hyun Jun, Seoul, both of Rep. of Korea

[73] Assignee: Hyundai Electronics Industries Co., Ltd., Ichon-shi, Rep. of Korea

[21] Appl. No.: 09/258,795

[22] Filed: Mar. 1, 1999

[30] Foreign Application Priority Data

Mar. 2, 1998 [KR] Rep. of Korea ......................... 98-6749
Jun. 12, 1998 [KR] Rep. of Korea ....................... 98-22020

[51] Int. Cl.$^7$ ..................................................... G11C 8/00
[52] U.S. Cl. ................................ 365/230.06; 365/230.03
[58] Field of Search ........................ 365/230.06, 230.03, 365/230.05, 185.18, 185.23, 185.25

[56] References Cited

U.S. PATENT DOCUMENTS

| | | | |
|---|---|---|---|
| 5,214,602 | 5/1993 | Lines .................................... | 365/189.11 |
| 5,255,224 | 10/1993 | Galbi et al. .......................... | 365/189.09 |
| 5,373,471 | 12/1994 | Saeki et al. ............................... | 365/200 |
| 5,406,526 | 4/1995 | Sugibayashi et al. .............. | 365/230.03 |
| 5,506,816 | 4/1996 | Hirose et al. ....................... | 365/230.06 |
| 5,521,887 | 5/1996 | Aimoto ................................ | 365/230.05 |
| 5,587,959 | 12/1996 | Tsukude .............................. | 365/230.06 |
| 5,602,796 | 2/1997 | Sugio ................................... | 365/230.06 |
| 5,631,872 | 5/1997 | Naritake et al. .......................... | 365/227 |
| 5,748,554 | 5/1998 | Barth et al. ......................... | 365/230.03 |

*Primary Examiner*—Richard Elms
*Assistant Examiner*—Anh Phung
*Attorney, Agent, or Firm*—Fleshner & Kim, LLP

[57] ABSTRACT

Disclose is a semiconductor memory device including a plurality of memory cell arrays, row and column decoders for selecting/driving each memory cell, and a plurality of bit line sensing amplifier arrays for sensing data of each memory cell, the semiconductor memory device comprising: a plurality of sub word line driver sections for driving each memory cell with a sub word line enable selection signal (SWLE) decoded by LSB address and with a global word line signal (GWLb) decoded by MSB address in the row decoder; a row decoding precharge signal generating section (RDPRi/VBFi) for applying a precharge signal to the row decoder and a voltage Vbb to the GWLb signal by means of the MSB address PXb; a level shifting section for shifting and transmitting an output signal from the column decoder to column selection lines which connects the column decoder with the bit line sensing amplifier array in series; and a data input/output controlling section for selectively applying an active signal to the bit line sensing amplifier array according to a level of the column selection line.

24 Claims, 8 Drawing Sheets

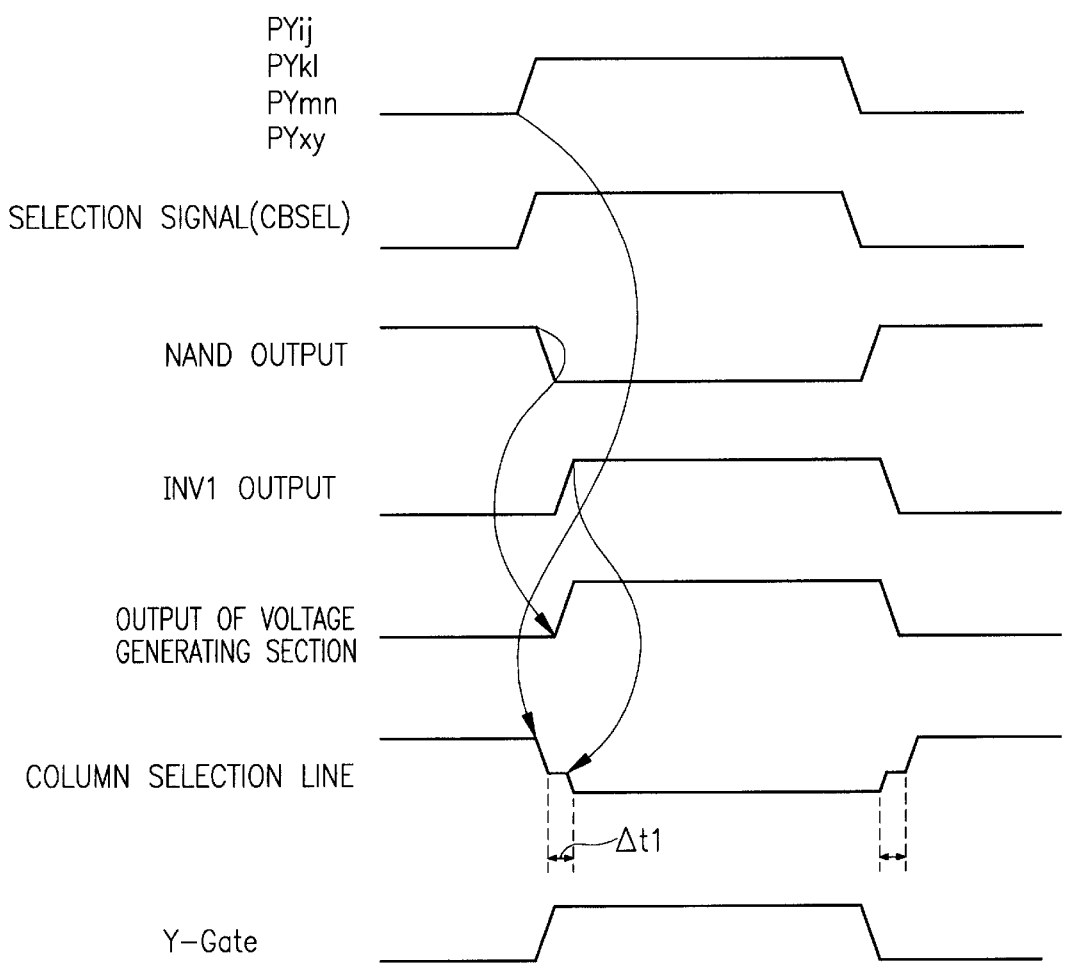

SEMICONDUCTOR MEMORY DEVICE

BACKGROUND OF THE INVENTION

1. Field of the Invention

The present invention relates to a semiconductor memory device and, more particularly, to a semiconductor memory device which drives a plurality of sub word line drivers using output signals (GWLB,SWLE) of a row decoder so as to efficiently control a column selection signal.

2. Discussion of the Related Art

A related art semiconductor memory device will be described below with reference to the accompanying drawings.

FIG. 1 shows the configuration of a related art semiconductor memory device.

The related art semiconductor memory device, on the whole, includes a memory cell array, a row decoder and sub word line driver section, and a column selection driver section.

The row decoder and sub word line driver section includes a plurality of sub word line driver (SWD) sections 3 for driving memory cells in memory cell array sections 4, a row decoder 2 for generating a plurality of global word line bar (GWLb) signals and global word line (GWL) signals in the SWD sections 3, the GWLb signals and GWL signals being decoded by the most significant bit (MSB) address, and a sub word line enable section 1 which generates a sub word line enable (SWLE) selection signal decoded by the least significant bit (LSB) address.

The column selection driver section includes a plurality of bit line sensing amplifier arrays 5 connected to each of the memory cell arrays 4, for sensing data, a plurality of column decoders 6 for decoding input column address, a plurality of column selection lines 7 for serially connecting each of the column decoders 6 with each of the bit line sensing amplifier arrays 5.

Here, each of the bit line sensing amplifier arrays 5 includes a plurality of sensing amplifiers 5a which are respectively connected to a bit line and a bit bar line. The bit line sensing amplifier arrays 5 include a sensing amplifier equalization and precharge enable section(EQ/PCH). Each of the bit lines and bit bar lines is connected to the cells in the memory cell array sections 4.

Y-gates 5b are connected to the bit lines and bit bar lines connected to each of the bit line sensing amplifiers 5a, so that the bit lines and bit bar lines are selected depending on turning on of the Y-gate 5b. Turning on/off of the Y-gate 5b is controlled by the corresponding column decoder 6. That is, among a plurality of column decoders 6, if a column decoder 6 corresponding to input address is selected, a column selection line 7 connected to the selected column decoder 6 is selected, so that Y-gate 5b connected to the selected column selection line 7 is turned on.

In this way, data in the memory cell is amplified by the sensing amplifiers, and then transmitted to a data line and a data bar line through selected bit lines and bit bar lines.

The operation of the related art semiconductor memory device will be described below by focusing on a row decoder and sub word line driver section.

FIG. 2a is a schematic view of a unit sub word line driver of the related art semiconductor memory device, and FIG. 2b is a timing chart showing the operation of a row decoder and the unit sub word line driver of the related art semiconductor memory device.

The sub word line driver includes a PMOS transistor P20 whose gate receives the GWLb signal from the row decoder 2, and an NMOS transistor N22, and an NMOS transistor N21 whose source is connected to the SWL. The drains of the PMOS transistor P20 and the NMOS transistor N22 are connected to the SWL. The SWLE signal generated by SWLE section 1 is applied to the source of the PMOS transistor P20 and the drain of the NMOS transistor N21, and the GWL signal generated by row decoder 2 is applied to the gate of the NMOS transistor N21.

In the row decoder and the unit sub word line driver of the related art semiconductor memory device, all the GWL signals and SWLE signals are in a state of low voltage during a period of t1, as shown in FIG. 2b. And, GWLb signal is in a state of boosted voltage. Accordingly, the PMOS transistor P20 which is connected to the GWLb line is turned off but the NMOS transistor N22 is turned on, thereby maintaining the SWL in a state of low voltage. At this time, the NMOS transistor N21 is turned off state.

During a period of time t2, the SWLE signal decoded by the LSB address has boosted voltage, the GWLb signal decoded by the MSB address has low voltage and the GWL signal has high voltage. Consequently, the PMOS transistor P20 and the NMOS transistor N21 are turned on while the NMOS transistor N22 is turned off, so that the boosted voltage of the SWLE signal is transmitted to the SWL, thereby generating the SWL signal.

The operation of the column selection driver of the related art semiconductor memory device will be described below.

FIG. 3 is a timing chart showing the operation of a column decoder and a bit line sensing amplifier array section of the related art semiconductor memory device. Among a plurality of column decoders 6 each connected to column selection lines 7, a column decoder 6 corresponding to input addresses (PYij, PYkl, PYmn, PYxy) is selected. If the column decoder 6 is selected, the column selection line 7 which is connected to the selected column decoder 6 is activated. Thus, Y-gate 5b connected to the activated column selection line 7 is turned on, so that data of a corresponding memory cell in the memory cell array section 4 is transmitted to the sensing amplifier 5a through the bit line and bit bar line. The sensing amplifier 5a senses and amplifies the data input through the bit line and bit bar line, and then outputs it through the data line and data bar line.

In the column selection driver of the related art semiconductor memory device, the sensing amplifier arrays 5 are commonly connected to the column selection lines 7, to write data in the memory cell array 4 and read data of the memory cell array 4 through the data line and data bar line.

However, the above-described related art semiconductor memory device has the following problems.

First, in the row decoder section, the GWL signal and GWLb signal which control a plurality of sub word lines are generated by the row decoder and connected to four SWDs. This means that there are two metal lines, GWLb and GWL signal lines, every four polysilicon word line. This causes defects in the word line during the fabrication process due to shortage of design rule margin. Furthermore, coupling noise is generated between the word lines and between the word line and the bit line, deteriorating the performance of memory chip.

Further, in the column selection driver, since the bit line sensing amplifier arrays are commonly connected to the column selection lines, if a random column selection line is activated, all the bit line sensing amplifier arrays connected to the column selection line are activated. This increases power consumption unnecessarily. Moreover, when the selected bit line sensing amplifier array transmits the corresponding data to the data line and data bar line, unselected bit line sensing amplifier array also transmits the data to the corresponding data line and data bar line. Accordingly, bit line precharge voltage and data line precharge voltage come into collision with each other in the unselected bit line sensing amplifier array, thereby increasing unnecessary power consumption. The larger the memory capacity is, the more power consumption increases. Also, loading of the column selection line is increased to reduce the processing speed. In order to prevent the precessing speed from being reduced, there is suggested a method of increasing the size of the driver. However, the more the size of the driver increases, the more power consumption increases.

SUMMARY OF THE INVENTION

Accordingly, the present invention is directed to a semiconductor memory device that substantially obviates one or more of the problems due to limitations and disadvantages of the related art.

An object of the present invention is to provide a semiconductor memory device which drives a plurality of sub word line drivers using output signals of its row decoder and controls a column selection signal efficiently.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof of well as the appended drawings.

To accomplish the object of the present invention, there is provided a semiconductor memory device including a plurality of memory cell arrays, row and column decoders for selecting/driving each memory cell, and a plurality of bit line sensing amplifier arrays for sensing data of each memory cell, the semiconductor memory device comprising: a plurality of sub word line driver sections for driving each memory cell with a sub word line enable selection signal (SWLE) decoded by LSB address and with a global word line signal (GWLb) decoded by MSB address in the row decoder; a row decoding precharge signal generating section (RDPRi/VBFi) for applying a precharge signal to the row decoder and a voltage Vbb to the GWLb signal by means of the MSB address PXb; a level shifting section for shifting and transmitting an output signal from the column decoder to column selection lines which connects the column decoder with the bit line sensing amplifier array in series; and a data input/output controlling section for selectively applying an active signal to the bit line sensing amplifier array according to a level of the column selection line.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 8 is a timing chart showing the operation of a column decoder and a bit line sensing amplifier array section of the semiconductor memory device according to the present invention.

DETAILED DESCRIPTION OF PREFERRED EMBODIMENT

Reference will now be made in detail to the preferred embodiments of the present invention, examples of which are illustrated in the accompanying drawings.

Figure 1:
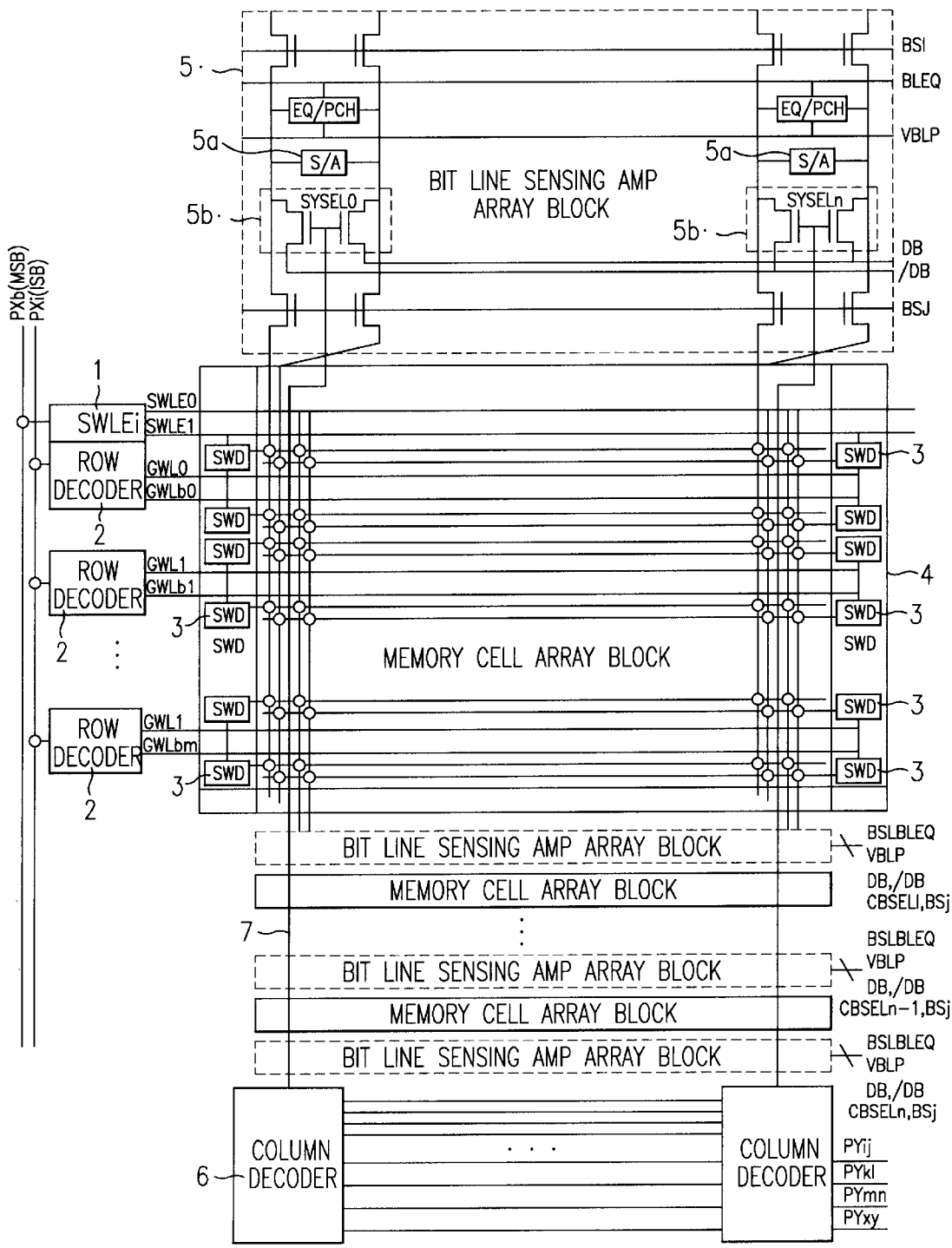
FIG. 1 shows the configuration of a related art semiconductor memory device.
Figure 2A:
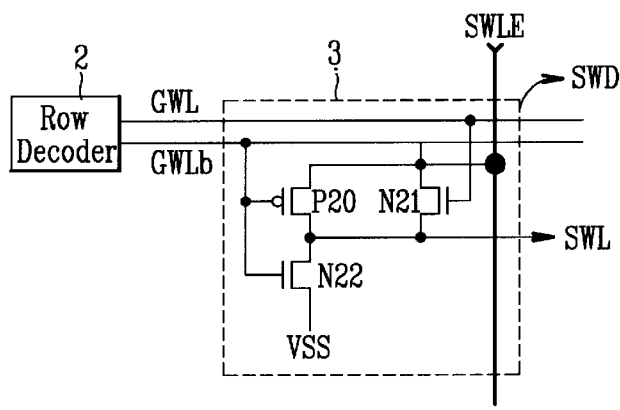
FIG. 2a is a schematic view of a unit sub word line driver of the related art semiconductor memory device.
Figure 2B:
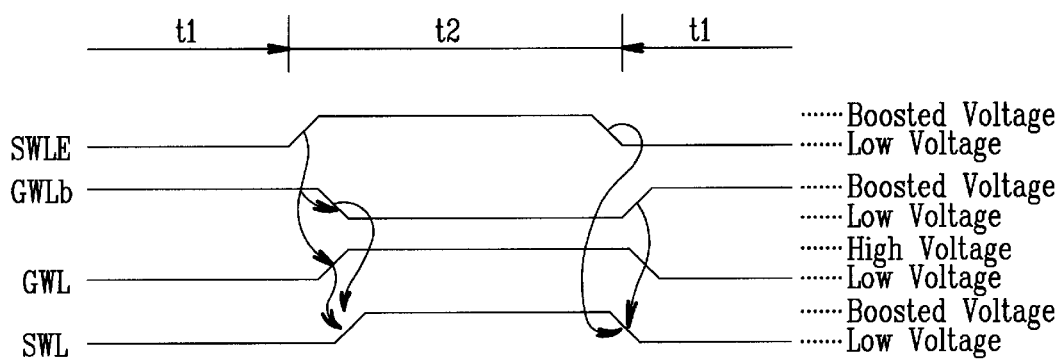
FIG. 2b is a timing chart showing the operation of a row decoder and the unit sub word line driver of the related art semiconductor memory device.
Figure 3:
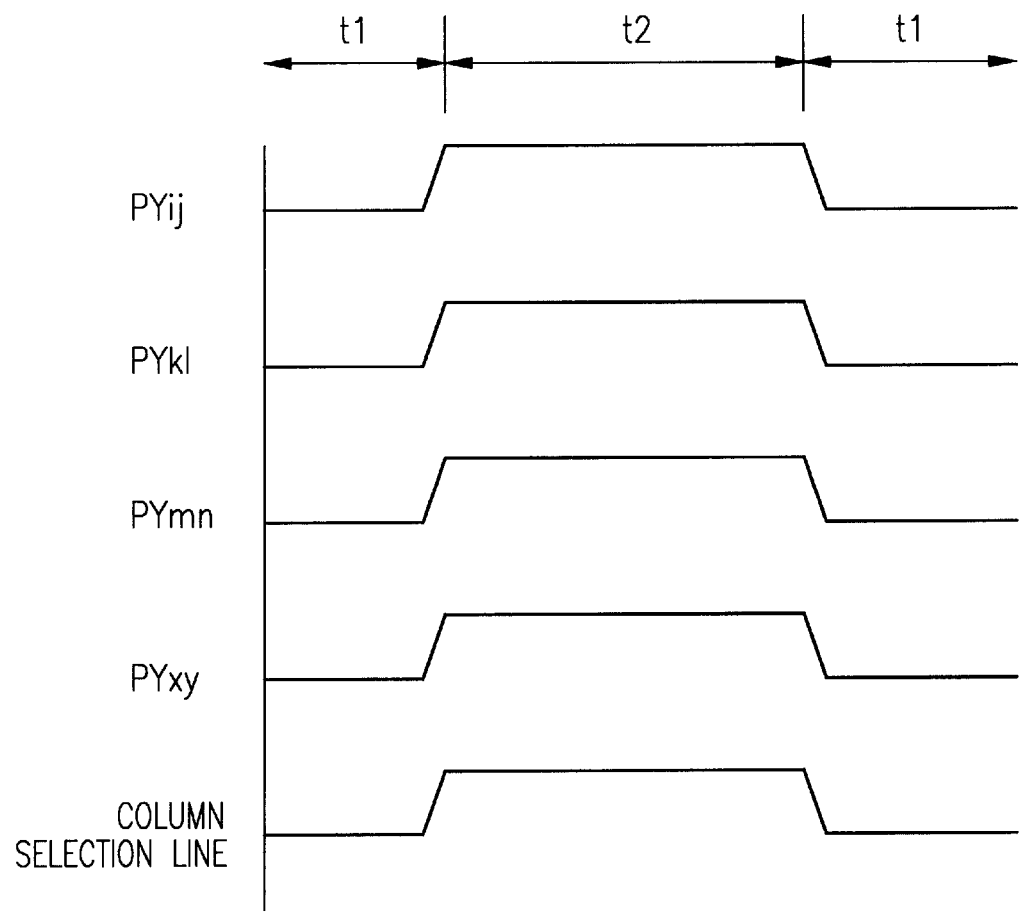
FIG. 3 is a timing chart showing the operation of a column decoder and a bit line sensing amplifier array section of the related art semiconductor memory device.
Figure 4:
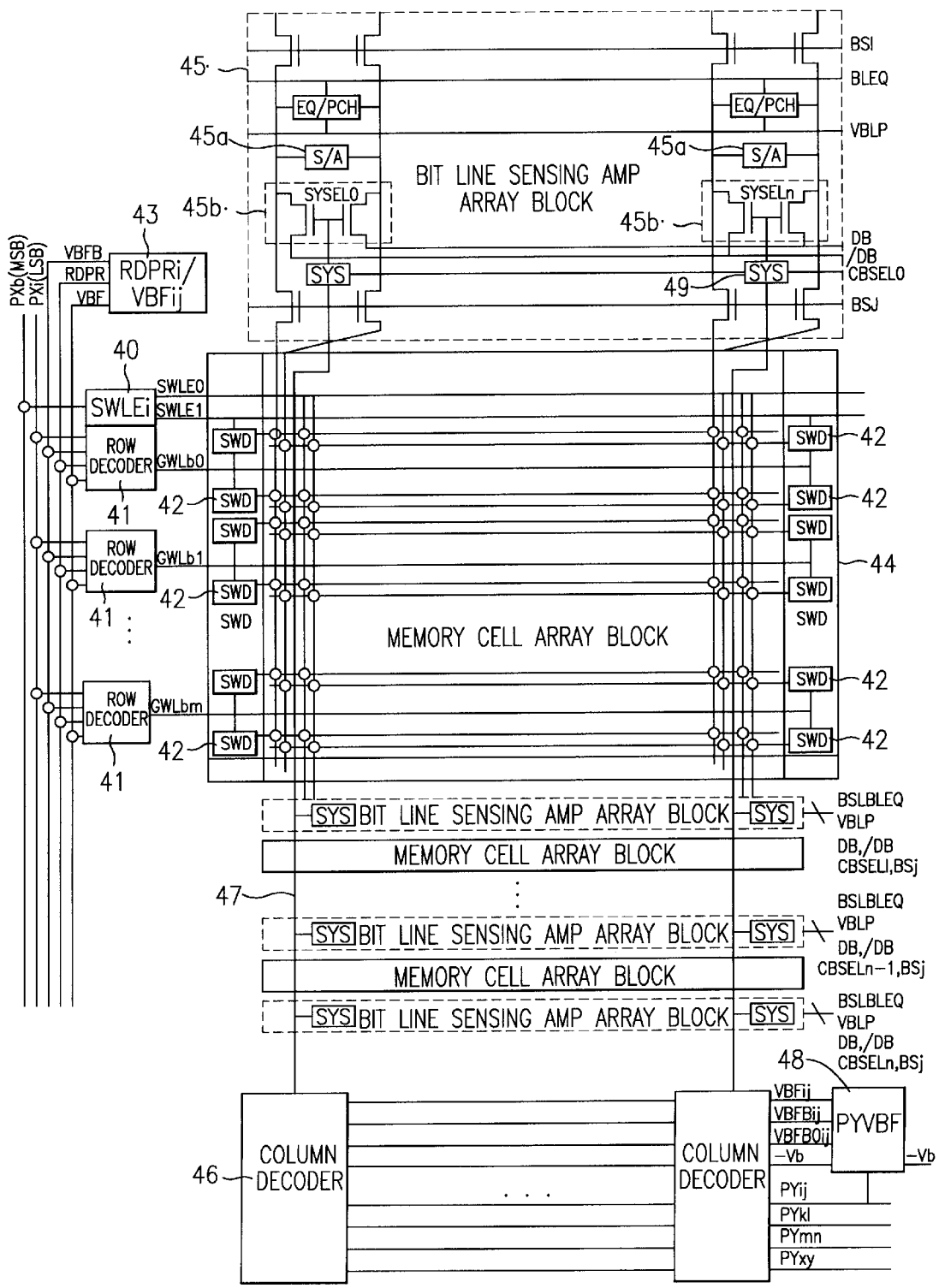
FIG. 4 is a schematic section diagram of a semiconductor memory device according to the present invention.

FIG. 4 is a schematic section diagram of a semiconductor memory device according to the present invention.

The semiconductor memory device of the present invention includes a plurality of memory cell arrays 44, a plurality of bit line sensing amplifier arrays 45 connected to each of the memory cell arrays 44, for sensing data of each memory cell array 44 through a bit line and bit bar line, a plurality of column decoders 46 for activating a column selection line 47 corresponding to an input address signal, a level shifting section 48 for controlling the level of the column selection line connected to the column decoder 46, a data input/output controlling section 49 for controlling a Y-gate 45b connected to the bit line and bit bar line so that the data output from the bit line sensing amplifier array 45 which is selected by the control signal of the level shifting section 48 may be output through the data line and data bar line(otherwise, so that the data input through the data line and data bar line may be stored in the memory cell through the bit line and bit bar line), a plurality of SWD sections 42 for driving the memory cells in the memory cell arrays 44, a row decoder 41 for applying a plurality of GWLb signals decoded by the MSB address to the SWD sections 42, a sub word line enable section 40 for generating an SWLE selection signal decoded by the LSB address, and a row decoding precharge signal generating section(RDPRi/VBFi) 43 for applying a precharge signal to the row decoder 41 and a voltage Vbb to the GWLb signal by means of the MSB address PXb.

The level shifting section 48 generates a control signal for controlling the level of the column selection line 47, in order to select one of the plurality of bit lines sensing amplifier arrays 45 which are connected to the column selection line 47. The bit line sensing amplifier arrays 45 include sensing amplifier equalization and precharge enable section (EQ/PCH). The column selection lines 47 are connected to each of the column decoders 46 to connect the bit line sensing amplifier arrays 45 in series.

The configuration and operation of the semiconductor memory device according to the present invention will be described below in detail.

Figure 5:
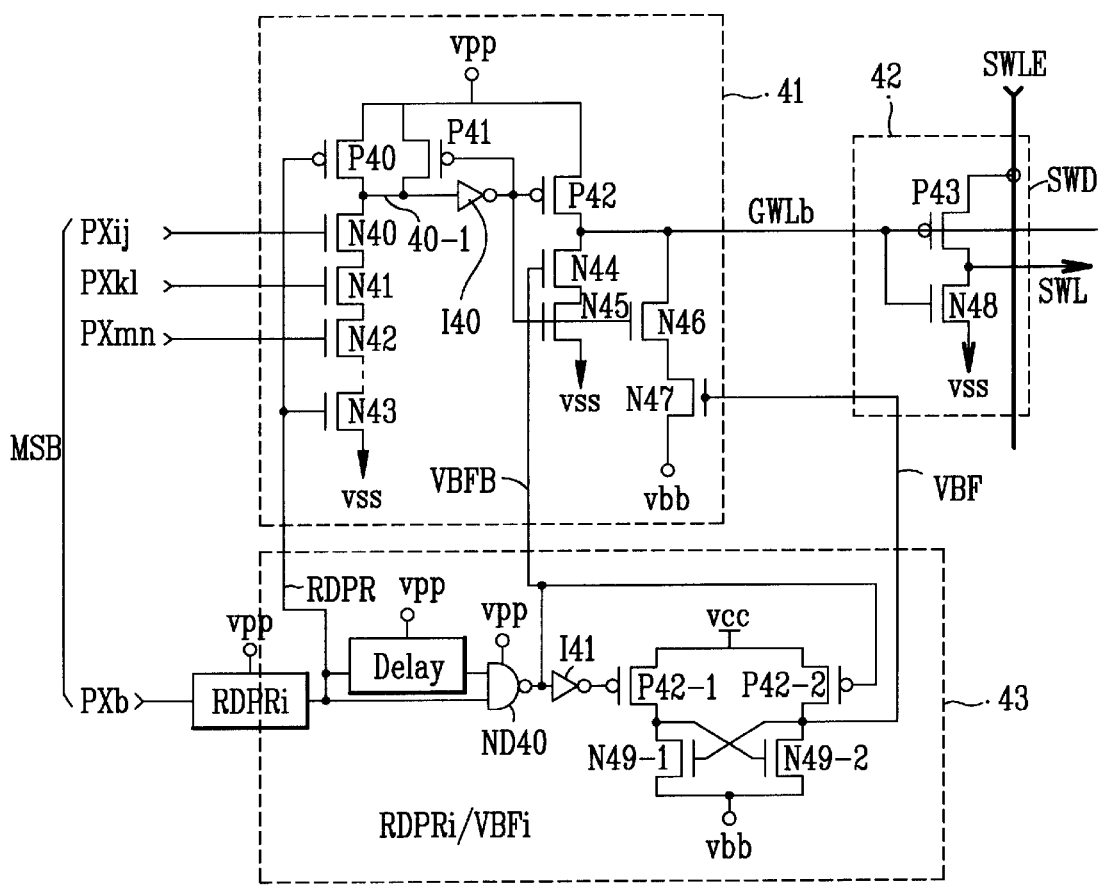
FIG. 5 is a detailed section diagram of a row decoder and sub word line driver of the semiconductor memory device according to the present invention.

FIG. 5 is a detailed section diagram of a row decoder and sub word line driver of the semiconductor memory device according to the present invention.

The row decoder 41 includes first, second and third PMOS transistors P40, P41 and P42, first, second, third and fourth NMOS transistors N40, N41, N42 and N43, an inverter I40, fifth and sixth NMOS transistors N44 and N45, a seventh NMOS transistor N46, and an eighth NMOS transistor N47. A voltage Vpp is applied to sources of the first, second and third PMOS transistors P40, P41 and P42. The first, second, third and fourth NMOS transistors N40, N41, N42 and N43 are connected in series. Source of the first NMOS transistor N40 is connected to drains of the first and second PMOS transistors P40 and P41. Decoding signals decoded by the MSB address output from the row decoding precharge signal generating section 43 are applied to gates of the NMOS transistors N40, N41, N42 and N43. The inverter I40 is connected to the drains of the first and second PMOS transistors P40 and P41. The fifth and sixth NMOS transistors N44 and N45 are connected in series, and the fifth NMOS transistor N44 is connected to drain of the third PMOS transistor P42 and an output terminal of the GWLb signal. Gate of the seventh NMOS transistor N46 is connected to an output terminal of the inverter I40 and its source is connected to the output terminal of the GWLb signal. Source of the eighth NMOS transistor N47 is connected to a ground voltage terminal and its drain is connected to the seventh NMOS transistor N46. A signal VBF is applied to a gate of the eighth NMOS transistor N47.

The gate of the second PMOS transistor P41 is connected to the output terminal of the inverter I40, and the gate of the first PMOS transistor P40 receives the row decoding precharge signal. The gate of the fifth NMOS transistor N44 receives VBFB signal.

The row decoding precharge signal generating section 43 includes a row decoding precharge signal generating section RDPRi which receives a signal PXb decoded by the MSB address to output a row decoding precharge signal, a delay for delaying the row decoding precharge signal, a NAND operation section for performing NAND operation of the delayed row decoding precharge signal and a row decoding precharge signal which has not delayed, an inverter I41 for inverting the output signal of the NAND operation section, first and second PMOS transistors P42-1 and P42-2 whose sources receive Vcc and gates receive the output signal of the inverter I41 and the output signal of the NAND operation section respectively, a first NMOS transistor N49-1 whose source receives Vbb and drain is connected to the drain of the first PMOS transistor P42-1, and a second NMOS transistor N49-2 whose source receives Vbb and drain is commonly connected to the drain of the second PMOS transistor P42-2 and output terminal of VBF signal.

Each SWD section acts as an inverter consisting of a PMOS transistor P43 and an NMOS transistor N48 whose gates receive the GWLB signal output from the row decoder 41. The SWLE signal is applied to the source of the PMOS transistor P43, and the SWL signal for driving the sub word line is output to the output terminal of the inverter.

The operation of the aforementioned semiconductor memory device of the present invention will be described below.

Figure 6:
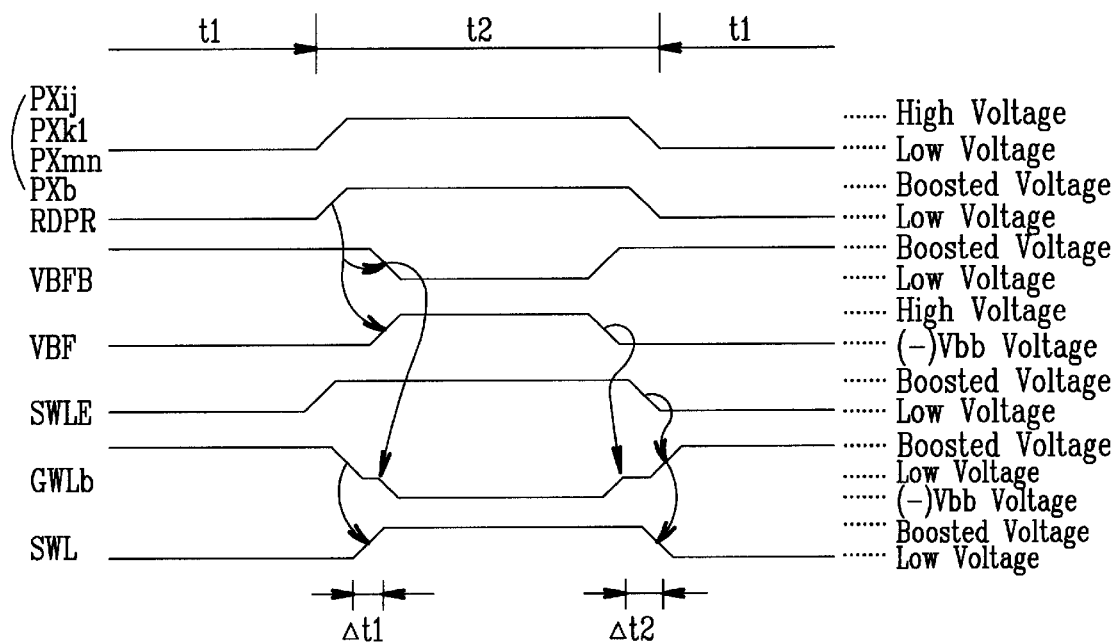
FIG. 6 is a timing chart showing the operation of a row decoder and sub word line driver of the semiconductor memory device according to the present invention.

FIG. 6 is a timing chart showing the operation of a row decoder and sub word line driver of the semiconductor memory device according to the present invention.

As shown in FIG. 6, during a period of time t1, the MSB addresses PXij, PXkl and PXmn have low voltage to turn off the first, second and third NMOS transistors N40, N41 and N42 of the row decoder 41, and the MSB address PXb also has low voltage to allow the output signal of RDPRi section to have low voltage. Consequently, the fourth NMOS transistor N43 is turned off but the first PMOS transistor P40 is turned on, so that boosted voltage is applied to a node N40-1. Thus, low voltage is applied to the third PMOS transistor P42 through the inverter I40 to turn it on, so that the boosted voltage is applied to the GWLb. At this time, while the SWLE signal is in low voltage state, the PMOS transistor P43 of the SWD section 42 is turned off but its NMOS transistor N48 is turned on, thereby supplying Vss to the SWL.

During a period of time t2, the mSB addresses PXij, PXkl and PXmn provide high voltage to turn on the first, second and third NMOS transistors N40, N41 and N42 of the row decoder 41, and the MSB address PXb provides high voltage to allow the RDPRi section to have the boosted voltage. Accordingly, the first PMOS transistor P40 is turned off but the fourth NMOS transistor N43 is turned on, so that the node N40-1 is in low voltage state. The value of voltage at the node N40-1 is changed into boosted voltage through the inverter I40, to be applied to the sixth and seventh NMOS transistors N45 and N46. Accordingly, the sixth and seventh NMOS transistors N45 and N46 are turned on. The signal output from the RDPRi section passes through the delay and NAND operation section ND40, to be output as a voltage generating signal VBFB. Here, the VBFB has the value of boosted voltage.

Since a voltage generating signal VBF which has passed the level shifting section is in a state of Vbb and thus the fifth, sixth and seventh NMOS transistors N44, N45 and N46 are turned on, so that low voltage is supplied to the GWLb. At this time, since the SWLE signal has the boosted voltage, the PMOS transistor P43 of the SWD section 42 is turned on while its NMOS transistor N48 is turned off, so that the boosted voltage is supplied to the SWL. After the period of time t1, the VBFB signal has low voltage and VFB signal has high voltage, to turn off the fifth NMOS transistor N44 and to turn on the eighth NMOS transistor N47, thereby providing Vbb to the GWLb. Accordingly, even if unnecessary noise is generated in an SWL which is not selected, it flows out through a non-selected SWLE line having low voltage by the PMOS transistor P43 of the SWD section 42.

Before the next period of time t1, the VBFB signal applies the boosted voltage to the NMOS transistor N44 and VFB signal applies vbb to the eighth NMOS transistor N47, to supply low voltage to the GWLb line for a period of time Δt2. Then, the selected SWLE has low voltage to make the SWL at low voltage. Here, the MSB addresses PXij, PXkl and PXmn have low voltage to turn off the fifth and sixth transistors N40 and N41 of the row decoder 41, and the MSB address PXb has low voltage to allow the RDPRi section to supply low voltage. Accordingly, the fourth NMOS transistor N43 is turned off but the first PMOS transistor P40 is turned on, to make the node N40-1 at the boosted voltage, and the sixth and seventh NMOS transistors N45 and N46 are turned off to provide the boosted voltage to the GWLb. While the SWLE signal is in low voltage state, the PMOS transistor P43 of the SWD section 42 is turned off but its NMOS transistor N48 is turned on, providing Vss to the SWL.

The detailed configuration of the column decoder and the bit line sensing amplifier array section of the semiconductor memory device is as follows.

Figure 7:
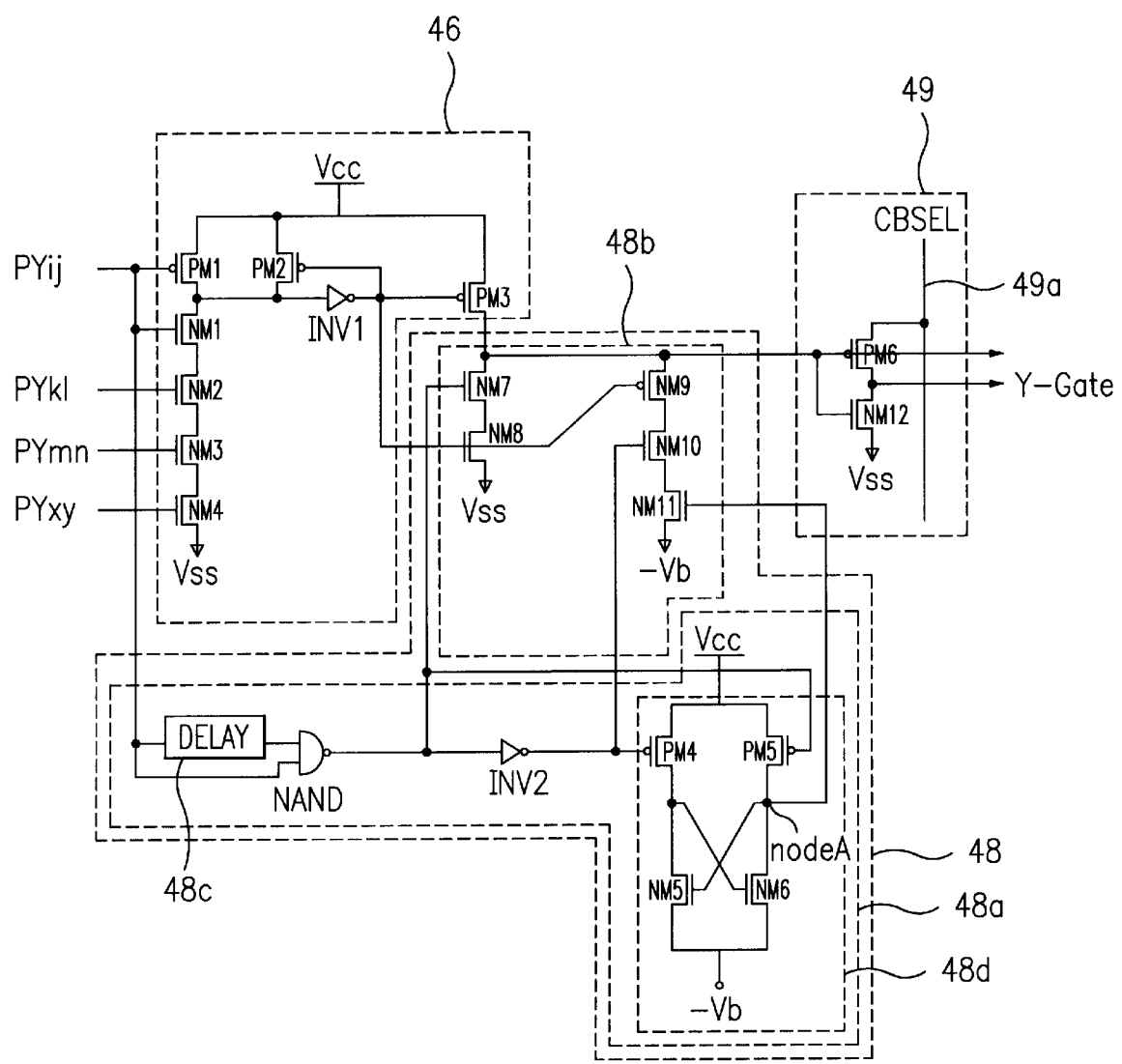
FIG. 7 shows the detailed configuration of a column decoder and a bit line sensing amplifier array section of the semiconductor memory device according to the present invention.

FIG. 7 shows the detailed configuration of the column decoder and the bit line sensing amplifier array section of the semiconductor memory device according to the present invention.

The column decoder 46 includes a PMOS transistor PM1 whose source is connected to a power terminal, the PMOS transistor PM1 being controlled by a gate input signal, and NMOS transistors NM1, NM2, NM3, and NM4 which are connected to the drain of the PMOS transistor PM1 in series. The source of the NMOS transistor NM4 is connected to the ground terminal. The column decoder 46 further includes a PMOS transistor PM2 whose drain and source are respectively connected to the drain and source of the PMOS transistor PM1, an inversion device INV1 for inverting the output of the PMOS transistors PM1 and PM2, and a PMOS transistor PM3 whose source is connected to the power terminal, the PMOS transistor PM3 being controlled by the signal output from the inversion device INV1.

The level shifting section 48 includes a control signal generating section 48a for generating a signal to control the level of the column selection line, and a level determination section 48b for practically determining the level of the column selection line in response to the control signal of the control signal generating section 48a.

The control signal generating section 48a includes a delay 48c for delaying the gate input signal of the PMOS transistor PM1 for a predetermined period of time $\Delta t1$, and a NAND gate for performing NAND operation of an output signal of the delay 48c and a signal prior to delay. The output signal from the NAND gate is used as a control signal for the level determination section 48b which will be described below.

The control signal generating section 48a further includes a second inversion device INV2 for inverting the output signal from the NAND gate. The output signal from the second inversion device INV2 is also used as a control signal for the level determination section 48b.

The control signal generating section 48a also includes a voltage generating section 48d which is composed of a PMOS transistor PM4 whose source is connected to the power terminal and which is controlled by a signal output from the second inversion device INV2, a PMOS transistor PM5 whose source is connected to the power terminal and which is controlled by a signal output from the NAND gate, an NMOS transistor NM5 whose drain is commonly connected to the drain of the PMOS transistor PM4, source is connected to the negative(−) voltage terminal −Vb and gate is connected to the drain of the PMOS transistor PM5, and an NMOS transistor NM6 whose drain is connected to the drain of the PMOS transistor PM5, source is connected to the negative(−) voltage terminal −Vb, and gate is connected to the drain of the PMOS transistor PM4.

The voltage generating section 48d selectively applies the power source voltage and the ground voltage to an NMOS transistor NM11 of the level determination section 48b in response to the output signal of the NAND gate and second inversion device INV2.

The level determination section 48b includes an NMOS transistor NM7 whose drain is connected to the output terminal of the column decoder 46 and which is controlled by the output signal from the NAND gate, an NMOS transistor NM8 whose source is connected to the ground terminal and which is controlled by an output signal from the first inversion device INV1 of the column decoder 46, an NMOS transistor NM9 whose drain is connected to the output terminal of the column decoder 46 and which is controlled by the output signal from the first inversion device INV1 of the column decoder 46, an NMOS transistor NM10 whose drain is connected to the source of the NMOS transistor NM9 and which is controlled by the output signal from the second inversion device INV2 of the control signal generating section 48a, and an NMOS transistor NM11 whose source is connected to the negative(−) voltage terminal Vb and drain is connected to the source of the NMOS transistor NM10, and which is controlled by a signal from node A of the control signal generating section 48a.

The negative(−) voltage Vb is the same as the threshold voltage of the PMOS transistor PM6 provided for the data input/output controlling section 49.

The level of the column selection line 47 is determined by the control signal generating section 48a and the level determination section 48b, and the determined signal is input to the data input/output controlling section 49.

The data input/output controlling sections 49, as shown in FIG. 4, are connected to every bit line sensing amplifier array section 45. In order to select one of the data input/output controlling sections 49 connected to every bit line sensing array section 45, a selection signal CBSEL is needed. According to the present invention, only the required data input/output controlling section 49 is possible to select, without selecting all the data input/output controlling sections 49 connected to each of the bit line sensing amplifier arrays 45. This minimizes power consumption.

The selected data input/output controlling section 49 controls the corresponding Y-gate 45b. If the Y-gate is turned on, data in the memory cell is sensed and amplified by the corresponding sensing amplifier 45a. Then, it is transmitted to the data line and data bar line through the bit line and bit bar line. Otherwise, the data transmitted through the data line and data bar line is stored in the memory cell through the bit line and bit bar line.

The selection signal CBSEL, as shown in FIG. 7, is applied through a selection signal applying line(active signal applying line) 49a which is connected to the source of the PMOS transistor PM6 provided for the data input/output controlling section 49.

The configuration of the aforementioned data input/output controlling section 49 will be described below.

The data input/output controlling section 49 includes a PMOS transistor PM6 and an NMOS transistor NM12.

The source of the PMOS transistor PM6 is connected to the selection signal applying line(active signal applying line), and the gate of the PMOS transistor PM6 is connected to the column selection line.

The gate of the NMOS transistor NM12 is also connected to the column selection line. The source of the NMOS transistor NM12 is connected to the ground terminal, and the drain to the output terminal of the PMOS transistor PM6.

The output terminal of the PMOS transistor PM6 is connected to the Y-gate 45b.

The operation of the column decoder and the bit line sensing amplifier array section will be described below.

FIG. 8 is a timing chart showing the operation of the column decoder and the bit line sensing amplifier array section of the semiconductor memory device according to the present invention.

During a period of time t1, provided that all the column addresses generated from the predecoder (not shown) are low signals, all the NMOS transistors NM1, NM2, NM3 and NM4 of the column decoder 46 are turned off. And, the PMOS transistor PM1 is turned on, so that high signal is applied to the input terminal of the first inversion device INV1. Accordingly, the first inversion device INV1 generates low signal to turn on two PMOS transistors PM2 and PM3. Turning on of the PMOS transistor PM3 allows power source voltage Vcc to be applied to the column selection line.

At this time, as shown in FIG. 8, since the selection signal CBSEL for selecting the data input/output controlling section 49 is in a low state, the PMOS transistor PM6 of the data input/output controlling section 49 is turned off and the NMOS transistor NM12 thereof is turned on, thereby generating a ground signal Vss toward the Y-gate 45b.

Then, during a period of time t2, the column address becomes high, so that the NMOS transistors NM1, NM2, NM3 and NM4 of the column decoder 46 shown in FIG. 7 are turned on and the PMOS transistor PM1 thereof are turned off. Accordingly, voltage Vss is applied to the input terminal of the first inversion device INV1, and the inversion device INV1 generates high signal.

The NMOS transistors NM8 and NM9 of the level determination section 48b are turned on by the output signal from the first inversion device INV1. At this time, the output from the NAND gate of the control signal generating section 48a is maintained with a high level during a period of time Δt1, i.e., during the time delayed by the delay 48c. The output signal of high level from the NAND gate is applied to the gate of the NMOS transistor NM7 in the level determination section 48b, so that the NMOS transistor NM7 is turned on. Accordingly, ground voltage Vss is applied to the column selection line through the NMOS transistors NM8 and NM7.

At this time, in the column selection line, the data input/output controlling sections 49 are connected in series correspondingly to the bit line sensing amplifier arrays 45. In order to select one of the data input/output controlling sections 49, a selection signal of high level is applied to the selection signal applying line(active signal applying line) 49a of a desired data input/output controlling section 49 at the instant that the column address is decoded by the column decoder 46. A selection signal of low level is applied to the selection signal applying line 49a of an undesired data input/output controlling section 49.

Since the column selection line has the voltage Vss, the PMOS transistor PM6 of each data input/output controlling section 49 is turned on and the NMOS transistor NM12 thereof is turned off.

In this way, one bit line sensing amplifier array 45 is selected by the column selection line and the selection signal (CBSEL) for selecting data input/output controlling section 49.

At this time, the output from the NAND gate of the control signal generating section 48a is maintained with a high level during a period of time Δt1 that is delayed by the delay 48c. And, the output signal from the NAND gate becomes low while passing through the second inversion device INV2, thereby turning on the PMOS transistor PM4. Turning on the PMOS transistor PM4 allows power source voltage Vcc to be applied to the gate of the NMOS transistor NM6, so that the NMOS transistor NM6 is turned on. Accordingly, the negative(−) voltage −Vb is applied to the node A through the NMOS transistor NM6.

Since the node "A" is connected to the gate of the NMOS transistor NM10 of the level determination section 48b, the NMOS transistor NM11 is turned off. It is noted that the NMOS transistor NM10 of the level determination section 48b has been maintained in a turned-off state. At this time, if the delay 48c in the control signal generating section 48a generates low signal, the NAND gate generates a signal of low level. Thus, the second inversion device INV2 generates high signal.

Consequently, the NMOS transistor NM7 of the level determination section 48b is turned off, so that it can not provide a ground voltage for the column selection line any more. And, since the second inversion device INV2 generates high signal, the NMOS transistor NM10 is turned on, and the PMOS transistor PM5 is turned on by an output signal from the NAND gate. Thus, the potential of the node A comes to be a power source voltage Vcc, to turn on the NMOS transistor NM11 of the level determination section 48b. Accordingly, negative(−) voltage −Vb is applied to the column selection line through the NMOS transistors NM11, NM10 and NM9. As a result, during the delay by the delay 48c, the column selection line maintains ground voltage Vss, and then negative(−) voltage −Vb after finishing the delay. Therefore, even if a noise is generated through a non-selected data input/output controlling section 49, it flows out through the selection signal applying line 49a having low potential, passing through the PMOS transistor PM6 of the data input/output controlling section 49.

The selected data input/output controlling section 49 transmits to a corresponding Y-gate high signal provided through the selection signal applying line 49a, to turn on the Y-gate. Turning on the Y-gate allows the data of the bit line to be generated to the data line and data bar line(read operation) or to be stored in the memory cell(write operation).

Then, if the column address becomes low, the output signal from the NAND gate becomes high before the delay period Δt1 by the delay 48c, to turn on the NMOS transistor NM7 of the level determination section 48b. And, the output signal from the second inversion device INV2 connected to the NAND gate becomes low, to turn on the NMOS transistor NM10.

At this time, negative(−) voltage −Vb is applied to the gate of the NMOS transistor NM11, so that low signal is applied to the column selection line during the delayed time Δt2.

Afterwards, turning on the PMOS transistor PM2 allows the NMOS transistors NM8 and NM9 in the level determination section 48b to be turned off. Accordingly, low signal can not be applied to the column selection line any more, and thus, power source voltage Vcc is applied to the column selection line.

And, the PMOS transistor PM6 of the data input/output controlling section 49 is turned off and the NMOS transistor NM12 thereof is turned on. This allows low signal to be provided for the corresponding Y-gate 45b. Consequently, the Y-gate connected to the bit line of the bit line sensing amplifier and to the data line and data bar line is turned off, thereby finishing the data read or write operation.

The aforementioned semiconductor memory device of the present invention has following advantages.

First, only the GWLb signal controlled by the MSB address is output from the row decoder. This prevents opening or short circuit from being generated in the word line during the fabrication process, thereby increasing the fabrication yield.

Second, voltage −Vbb is applied to the selected GWLb, to allow the PMOS transistor to cancel noise. Accordingly, it is possible to reduce the number of transistors of the SWD section as compared with the related art SWD section, resulting in decrease in the entire area of semiconductor memory chip.

Third, an active signal is provided for only a desired Y-gate by a column selection line signal output from the column decoder and by a selection signal applied through the selection signal applying line, thereby minimizing power consumption.

Fourth, since only the output data from the selected sensing amplifier is transmitted to the data line and data bar line, power consumption can be minimized and bit line precharge voltage and data line precharge voltage are not collided against each other in the non-selected sensing amplifier.

Finally, it is possible to reduce a load applied to the column selection line during the operation of the semiconductor memory device, so that the speed of the semiconductor memory device can be increased.

It will be apparent to those skilled in the art that various modifications and variations can be made in the semiconductor memory device of the present invention without departing from the spirit or scope of the invention. Thus, it is intended that the present invention cover the modifications and variations of this invention provided they come within the scope of the appended claims and their equivalents.

What is claimed is:

1. A semiconductor memory device including a plurality of memory cell arrays, row and column decoders for selecting/driving each memory cell, and a plurality of bit line sensing amplifier arrays for sensing data of each memory cell, the semiconductor memory device comprising:

a plurality of sub word line drivers for driving each memory cell with a sub word line enable selection signal decoded by a least significant bit address and with a global word line signal decoded by a most significant bit address in the row decoder;

a row decoding precharge signal generator for applying a precharge signal to the row decoder and a first voltage to the global word line signal based on the most significant bit address;

a level shifting circuit for shifting and transmitting an output signal from the column decoder to column selection lines which connect the column decoder with the bit line sensing amplifier array in series; and a data input/output controller for selectively applying an active signal to the bit line sensing amplifier array according to a level of the column selection line.

2. The semiconductor memory device of claim 1, wherein the data input/output controller includes:

a first transistor having a source connected to a selection signal applying line applying an active signal and which is controlled by the level of the column selection line; and a second transistor having a drain connected to the first transistor in series and a source connected to a ground terminal and which is controlled by the level of the column selection line.

3. The semiconductor memory device of claim 2, wherein the first transistor and the second transistor are of types opposite to each other.

4. The semiconductor memory device of claim 3, wherein the first transistor is a PMOS transistor and the second transistor is an NMOS transistor.

5. The semiconductor memory device of claim 2, wherein the selection signal applying line corresponds to each data input/output controller, and only the data input/output controller having the selection signal applying line which receives a high signal generates an active signal to a corresponding sensing amplifier.

6. The semiconductor memory device of claim 1, wherein the data input/output controller comprises a plurality of data input/output controlling circuits, each data input/output controlling circuit is connected to a respective column selection line for each bit line sensing amplifier array, and only one of the data input/output controlling circuits is selected at an instance of time to apply the active signal to the corresponding bit line sensing amplifier array.

7. A semiconductor memory device comprising:

a plurality of memory cell arrays;

a plurality of sub word line drivers corresponding to and driving cells in the memory cell arrays;

a row decoder for applying a plurality of global word line signals decoded by a most significant bit address to the sub word line drivers;

a sub word line enable section for generating a sub word line enable selection signal decoded by a least significant bit address to the sub word line driver section; and a row decoding precharge signal generator for applying a precharge signal to the row decoder and a first voltage to the global word line signal based on the most significant bit address.

8. The semiconductor memory device of claim 7, wherein the row decoder comprises:

first, second and third PMOS transistors having sources that receive a second voltage;

first, second, third and fourth NMOS transistors having gates that receive a signal decoded by the most significant bit address and which are respectively connected in series, a source of the first NMOS transistor being connected to drains of the first and second PMOS transistors;

an inverter connected to the drains of the first and second PMOS transistors;

fifth and sixth NMOS transistors connected in series, the fifth NMOS transistor being connected to the drain of the third PMOS transistor and an output terminal of the global word line signal;

a seventh NMOS transistor having a gate connected to an output terminal of the inverter, and a source that is connected to the output terminal of the global word line signal; and an eighth NMOS transistor having a source connected to a ground terminal, a drain connected to the seventh NMOS transistor, and a gate that receives a first voltage generating signal output from the row decoding precharge signal generator.

9. The semiconductor memory device of claim 8, wherein a gate of the second PMOS transistor is connected to the output terminal of the inverter, and a gate of the first PMOS transistor receives the row decoding precharge signal.

10. The semiconductor memory device of claim 8, wherein a gate of the fifth NMOS transistor receives a second voltage generating signal.

11. The semiconductor memory device of claim 7, wherein the row decoding precharge signal generator comprises:

a row decoding precharge signal generating circuit for receiving a first signal decoded by a most significant bit address and outputting the row decoding precharge signal;

a delay for delaying the row decoding precharge signal;

a NAND operating circuit for performing a NAND operation of the row decoding precharge signal that is delayed and of the row decoding precharge signal that is not delayed;

an inverter, for inverting an output signal of the NAND operating circuit;

first and second PMOS transistors having sources that receive a second voltage and gates that receive an output signal of the inverter, and an output signal of the NAND operating circuit, respectively;

a first NMOS transistor having a source that receives the first voltage and a drain connected to a drain of the first PMOS transistor; and a second NMOS transistor having a source that receives the first voltage and a drain commonly connected to a drain of the second PMOS transistor and an output terminal of a voltage generating signal.

12. The semiconductor memory device of claim 7, wherein the sub word line driver section is an inverter including a PMOS transistor and an NMOS transistor having gates that receive the global word line signal output from the row decoder.

13. The semiconductor memory device of claim 12, wherein a source of the PMOS transistor receives the sub word line enable signal such that the inverter outputs a word line signal for driving the sub word line.

14. A semiconductor memory device including a plurality of memory cell arrays and a plurality of bit line sensing amplifier arrays, the semiconductor memory device comprising:

a plurality of column decoders for decoding an input N bit column address;

a column selection line connected to every column decoder, for connecting the bit line sensing amplifier arrays in series;

a level shifting circuit for controlling an output level of the column decoder for transmitting a signal to the column selection line; and a data input/output controller coupled to the column selection line for selectively applying an active signal to the corresponding bit line sensing amplifier array based on the input N bit column address through a selection signal applying line according to a level of the column selection line.

15. The semiconductor memory device of claim 14, wherein the selection signal applying line is connected to each data input/output controller.

16. The semiconductor memory device of claim 15, wherein only the data input/output controller having the selection signal applying line which receives a high signal generates an active signal to the corresponding bit line sensing amplifier array.

17. The semiconductor memory device of claim 14, wherein the level shifting circuit includes a control signal generator for generating control signals to control the level of the column selection line, and a level determination circuit for determining the level of the column selection line according to the control signals, thereby applying a ground voltage to the column selection line for a predetermined period of time.

18. The semiconductor memory device of claim 17, wherein the control signal generator comprises:

a delay for delaying the address signal applied to the column decoder among the input N bit column addresses for a predetermined period of time;

a NAND gate for performing a NAND operation of the address signal which is not delayed and the output signal of the delay, and generating a first control signal to the level determination circuit;

an inverter for inverting the output of the NAND gate and generating a second control signal to the level determination section; and a voltage generator for selectively generating a power voltage or negative voltage to the level determination section according to the first and second control signals.

19. The semiconductor memory device of claim 18, wherein the voltage generator comprises:

a first PMOS transistor having a source connected to a power voltage terminal, and which is controlled by an output signal of the inverter;

a second PMOS transistor having a source connected to the power voltage terminal, and which is controlled by an output signal of the NAND gate;

a first NMOS transistor having a source connected to a negative voltage terminal and a drain connected to an output terminal of the first PMOS transistor, and which is controlled by an output voltage of the PMOS transistor PM5; and a second NMOS transistor having a source connected to the negative voltage terminal and a drain connected to an output terminal of the second PMOS transistor and which is controlled by an output voltage of the first PMOS transistor.

20. The semiconductor memory device of claim 17, wherein the level determination section comprises:

first NMOS transistor having a drain connected to the column selection line, and which is controlled by a first one of the control signals output from the control signal generator;

a second NMOS transistor having a source connected to the ground terminal and a drain connected to a source of the first NMOS transistor, and which is controlled by an output signal of the column decoder;

a third NMOS transistor having a drain connected to the column selection line, and which is controlled by the output signal of the column decoder;

a fourth NMS transistor having a drain connected to a source of the third NMS transistor, and which is controlled by a second one of the control signals output from the control signal generator; and a fifth NMS transistor having a drain connected to the source of the fourth NMS transistor and a source connected to a negative voltage terminal, and which is controlled by an output signal of the voltage generator.

21. The semiconductor memory device of claim 18, wherein the level determination circuit applies a ground voltage to the column selection line during a delay of a predetermined period of time of an address signal applied to the column decoder among the N bit column addresses input to the delay.

22. The semiconductor memory device of claim 21, wherein negative(−) voltage is applied to the column selection line after the predetermined period of time.

23. The semiconductor memory device of claim 14, wherein the level of the column selection line is changed in an order of power voltage, ground voltage, and negative(−) voltage.

24. The semiconductor memory device of claim 14, wherein the data input/output controller comprises a plurality of data input/output controlling circuits, and each data input/output controlling circuit is connected to a respective column selection line for each bit line.

\* \* \* \* \*